(12) United States Patent
Haase et al.

(10) Patent No.: US 7,629,206 B2
(45) Date of Patent: Dec. 8, 2009

(54) PATTERNING SELF-ALIGNED TRANSISTORS USING BACK SURFACE ILLUMINATION

(75) Inventors: Michael Albert Haase, St. Paul, MN (US); Robert A. Street, Palo Alto, CA (US)

(73) Assignees: 3M Innovative Properties Company, St. Paul, MN (US); Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 11/710,880

(22) Filed: Feb. 26, 2007

(65) Prior Publication Data
US 2008/0206914 A1 Aug. 28, 2008

(51) Int. Cl.
*H01L 21/00* (2006.01)
*H01L 21/84* (2006.01)

(52) U.S. Cl. .................. 438/149; 438/157; 257/E21.41; 257/E21.278; 257/E21.253; 257/E21.329; 257/E21.347

(58) Field of Classification Search .................. 438/149, 438/151, 159, 158, 308, 712, 723, 742
See application file for complete search history.

(56) References Cited

U.S. PATENT DOCUMENTS

| 4,689,116 | A | 8/1987 | Coissard et al. |
| 4,834,507 | A | 5/1989 | Kato et al. |
| 4,836,650 | A | 6/1989 | Morin et al. |
| 4,918,504 | A | 4/1990 | Kato et al. |
| 5,177,577 | A | 1/1993 | Taniguchi et al. |
| 5,299,041 | A | 3/1994 | Morin et al. |
| 5,339,181 | A | 8/1994 | Kim et al. |
| 5,394,258 | A | 2/1995 | Morin et al. |
| 5,402,254 | A | 3/1995 | Sasano et al. |
| 5,441,905 | A | 8/1995 | Wu |
| 5,610,082 | A | 3/1997 | Oh |
| 6,184,069 | B1 | 2/2001 | Wu |
| 6,543,901 | B2 | 4/2003 | Moon |
| 6,563,174 | B2 | 5/2003 | Kawasaki et al. |
| 6,927,830 | B2 * | 8/2005 | Chung et al. ................. 349/149 |

(Continued)

FOREIGN PATENT DOCUMENTS

EP 1662571 5/2006

(Continued)

OTHER PUBLICATIONS

Ohya, "Thin Film Transistor of ZnO Fabricated by Chemical Solution Deposition", Jpn. J. Appl. Phys., vol. 40, pp. 297-298, 2001.

(Continued)

*Primary Examiner*—David Nhu
(74) *Attorney, Agent, or Firm*—Hollingsworth & Funk, LLC

(57) ABSTRACT

Fabrication methods for making thin film devices on transparent substrates are described. Gate, source, and drain electrodes of a transistor are formed on a transparent substrate. The widths of the drain electrode and source electrodes are greater than a width of the gate electrode. A dielectric layer is formed on the gate electrode. A semiconductor layer is deposited proximate to the gate, source and drain electrodes. Photoresist is deposited on the semiconductor. The photoresist is exposed to light directed through the transparent substrate so that the gate electrode masks the photoresist from the light. The semiconductor layer is removed in regions exposed to the light.

15 Claims, 8 Drawing Sheets

U.S. PATENT DOCUMENTS

| | | | |
|---|---|---|---|
| 7,176,488 B2* | 2/2007 | Kim et al. | 257/59 |
| 2002/0079501 A1 | 6/2002 | Okada et al. | |
| 2006/0091793 A1 | 5/2006 | Baude et al. | |
| 2006/0228974 A1 | 10/2006 | Thelss | |

FOREIGN PATENT DOCUMENTS

| | | |
|---|---|---|
| JP | 62106666 | 5/1987 |
| JP | 02245738 | 10/1990 |

OTHER PUBLICATIONS

Wagner, "Transparent Electronics", Science, vol. 300, May 23, 2003.

J. Richard, M. Bonnel, B. Vinouze, J.L. Favennec, P. Weisse, U. Bessonnat, G. Gerard, S. Salaun, M. LeContellec, and F. Morin, *Large LCD Panel Addressed by 320x320 TFT Array*, Proceedings of the SID, vol. 26/3, 1985, pp. 209-212.

Y. Lebosq, M. LeContellec, F. Morin, S. Salaun and P. Weisse, *An Improved Design of Active Matrix LCD Requiring only Two Photolithrographic Steps*, 1985 International Display Research Conference, CH2239 -2/85/0000-0034 © 1985 IEEE, pp. 34-36.

Arai, T. et al., *Nanostructure and electrical properties of anodized Al gate insulator for thin film transistors*, Mat. Res. Soc. Symp., vol. 424, p. 37 (1997).

R.A Street (ED.), *Technology and Applications of Amorphous Silicon*; ISBN 3-540-65714-2; Springer-Verlag Berlin Heidelberg 2000.

U.S. Appl. No. 11/678,865, filed Feb. 26, 2007, Haase et al.

U.S. Appl. No. 11/678,877, filed Feb. 26, 2007, Haase et al.

* cited by examiner

PATTERNING SELF-ALIGNED TRANSISTORS USING BACK SURFACE ILLUMINATION

TECHNICAL FIELD

The present invention is related to methods of fabricating transistors, and more particularly to patterning self-aligned transistors using back surface illumination through a transparent substrate.

BACKGROUND

Electronic device fabrication by conventional methods uses high resolution photolithography processes to form multilayer devices. These high-resolution processes require substantial investment in equipment to achieve precise layer-to-layer alignments on substrates that are relatively flat and rigid.

The processes and requirements of previous conventional photolithographic techniques are less successful when fabricating devices on flexible, stretchable substrates, especially when the substrate is a polymer. Fabrication of electronic devices such as thin film transistors on flexible substrates generally requires relaxed registration tolerance between device layers. In particular, polymer substrates may be prone to shrinkage or expansion due to thermal processing, and/or to absorption or desorption of water or other solvents, making layer to layer alignment difficult for conventional designs. Furthermore, conventional techniques are not generally amenable to manufacture using high-speed, roll-to-roll processes.

It is desirable to form transistors and/or other electronic devices on substrates that are flexible or stretchable. It is also desirable to fabricate such devices using low-cost roll-to-roll processing. The present invention fulfils these and other needs, and offers other advantages over the prior art.

SUMMARY

Embodiments of the invention are directed to patterning self-aligned transistors by using back surface exposure to light through a transparent substrate. In one embodiment, gate, source, and drain electrodes of a transistor are formed on a transparent substrate. A width of the drain electrode and a width of the source electrode are greater than a width of the gate electrode. A dielectric layer is formed on the gate electrode. A semiconductor layer is deposited proximate to the gate, source, and drain electrodes. Photoresist is deposited on the semiconductor. The photoresist is exposed to light directed through the transparent substrate. The gate electrode masks the photoresist from the light. The semiconductor layer is removed in regions exposed to the light.

In one configuration, gate electrodes of the transistors are formed on a first (e.g., front) surface of a transparent substrate, such as a flexible and/or polymeric substrate. A semiconductor layer, such as ZnO or a-Si:H, is deposited over the gate electrodes. Drain and source electrodes are formed having widths greater than the width of the gate electrodes. For example, in one configuration, the width of at least one of the drain and source electrodes is greater than about three times the width of the gate electrodes. The widths of the drain and source electrodes and the width of the gate electrode accommodates misregistration of the gate electrodes relative to at least one of the drain and source electrodes. Photoresist is deposited on the semiconductor layer. The photoresist is developed by exposure to light directed through a second (e.g., back) surface of the substrate. The gate electrodes mask the photoresist from the light. The semiconductor layer is removed in regions where the photoresist was exposed to the light.

The photoresist may optionally be developed by an additional exposure of the photoresist through a mask to light directed toward the first surface of the substrate. In one configuration, the alignment tolerance of the mask relative to the enable lines is the same as the registration tolerance between the gate electrodes relative to the drain and source electrodes. For example, the alignment tolerance of the mask may be about ±100 microns.

Another embodiment of the invention is directed to a method of fabricating a display backplane. Enable lines of the display backplane are formed on a first surface of a transparent substrate. The enable lines are gate electrodes for the pixel transistors. A semiconductor layer is deposited over the enable lines. An array of pixel electrodes and data lines is formed. The pixel electrodes and the data lines form source and drain electrodes of the pixel transistors. Photoresist is deposited on the semiconductor layer. The photoresist is developed by exposure to light directed through a second surface of the transparent substrate. The enable lines mask the photoresist from the light. The semiconductor layer is removed in regions where the photoresist was exposed to the light.

In some embodiments, the photoresist is also exposed to light directed toward the first surface of the substrate through a mask.

In one backplane configuration, the pixel electrodes are formed in columns and each pixel electrode includes an electrode extension oriented substantially orthogonal to the enable lines. The electrode extensions form the source or drain electrode of the pixel transistors. In one implementation, the electrode extensions extend in a direction of the column along an edge of a next pixel electrode in the column. A length of the electrode extensions may be selected to achieve a desired registration tolerance between backplane layers. Substrate distortion during fabrication may result in alignment of the enable lines and the pixel electrodes that varies across the backplane. In some configurations, storage capacitors are formed where the enable lines cross the pixel electrodes.

Another embodiment of the invention involves a method of fabricating a display backplane. The method includes patterning enable lines on a front surface of a transparent substrate. A semiconductor layer is deposited over the enable lines, the enable lines forming gate electrodes of transistors. Photoresist is deposited over the semiconductor layer. Using back surface exposure of the photoresist to light through the transparent substrate, ungated semiconductor material is removed.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1A:
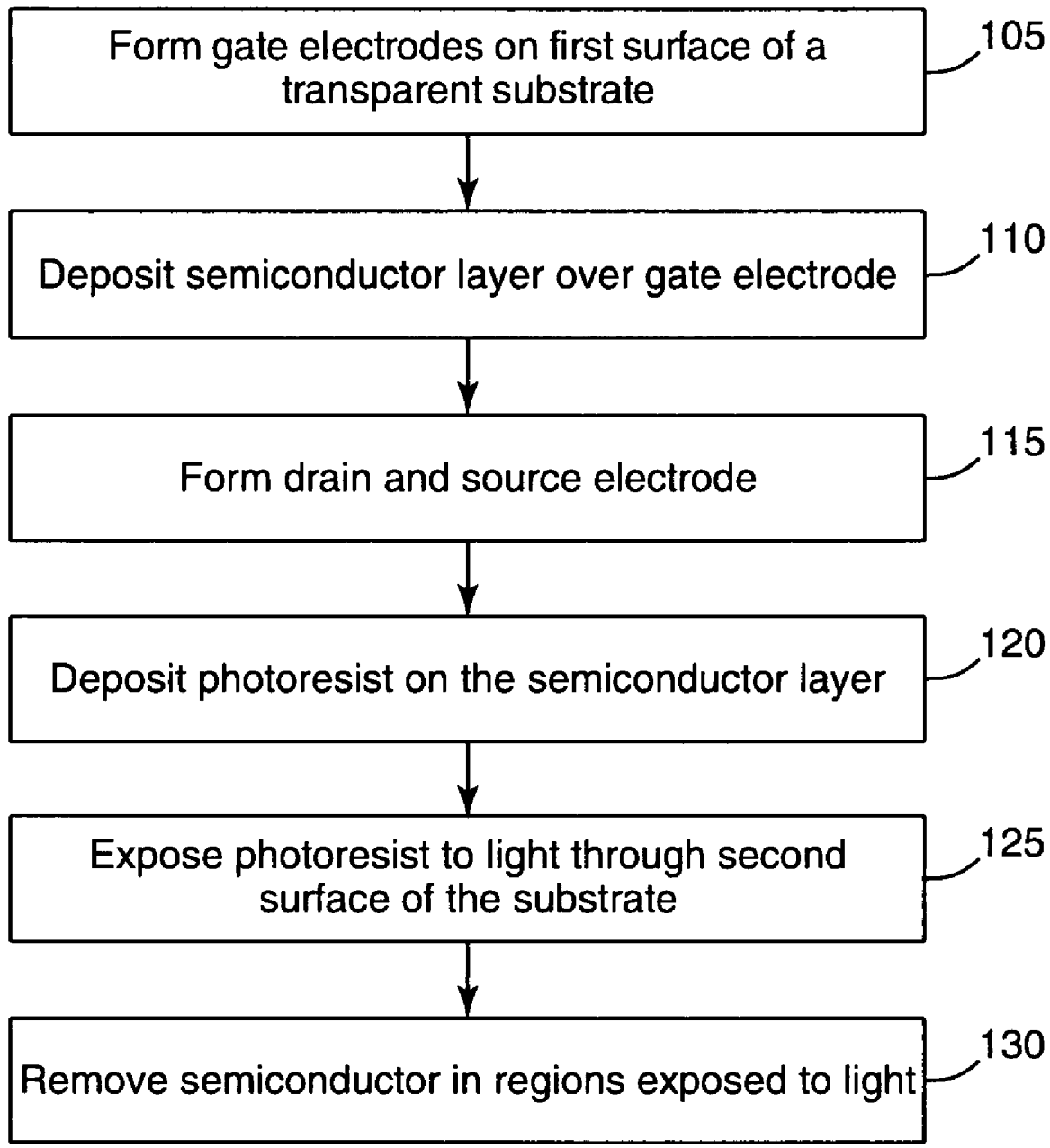
FIGS. 1A and 1B are diagrams illustrating methods of using back surface illumination to form transistors in accordance with embodiments of the invention.

While the invention is amenable to various modifications and alternative forms, specifics thereof have been shown by way of example in the drawings and will be described in detail. It is to be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

In the following description of the illustrated embodiments, reference is made to the accompanying drawings that form a part hereof, and in which are shown by way of illustration, various embodiments in which the invention may be practiced. It is to be understood that the embodiments may be utilized and structural changes may be made without departing from the scope of the present invention.

Embodiments of the invention are directed to methods for fabricating thin film transistors (TFT) on a transparent substrate using back surface illumination through the substrate to pattern the semiconductor regions. Although the illustrated embodiments are specific to TFT design, the methods described herein are generally applicable to fabrication of electronic devices where relaxed registration between device layers is desired.

In general, it is undesirable to design a TFT with a region of ungated semiconductor, i.e., an area of semiconductor material that is not proximate the gate electrode. The current in the ungated region cannot be controlled by a gate bias. The contribution from the current in the ungated region to the total current depends on undetermined local potentials and may vary erratically.

The problem is solved by removing ungated semiconductor between the source and drain electrodes. However, when the substrate is flexible or stretchable, it is difficult to remove the ungated semiconductor using conventional photolithographic techniques because the misregistration between layers prevents patterning the semiconductor close to the edge of the gate. However, if the gate itself is used as a mask for back surface exposure of the photoresist, misregistration of the mask is not a factor. Using back surface exposure to light, the semiconductor material in ungated regions is removed and the semiconductor in gated regions, i.e., regions proximate to the gate, is retained. Any semiconductor may be patterned in this way including ZnO or other oxides such as InZnO, thin film silicon, e.g., amorphous silicon or polysilicon, or organic semiconductors, such as pentacene or polythiophene.

The patterning techniques described herein are generally not necessary for fabrication of electronic devices on rigid substrates such as glass where the registration tolerance between layers can be small. However, patterning via back surface illumination may be useful when using a photolithography tool that requires a relatively large registration tolerance. Patterning using back surface illumination is particularly useful for batch or roll-to-roll processing of thin film devices deposited on flexible substrates because flexible substrates, especially plastics, generally require significant registration tolerance between the device layers.

A transistor fabrication method in accordance with embodiments of the present invention involves forming the three electrodes of the transistor on a transparent substrate. A width of the two of the electrodes, e.g., drain and source electrodes is greater than a width of another electrode, e.g., gate electrode. A gate dielectric layer is formed. A semiconductor layer is deposited proximate to the transistor electrodes. Photoresist is deposited on the semiconductor layer. The photoresist is exposed to light directed through the transparent substrate, the gate electrode masking the photoresist from the light. The semiconductor layer is removed in regions exposed to the light.

The order in which the semiconductor layer and the electrodes are arranged on the substrate may vary. For example, in one configuration, the gate electrode is deposited on a first surface of the transparent substrate followed by the semiconductor layer and then the drain and source electrodes. In another configuration, the gate electrode is deposited on the first surface. Drain and source electrodes are deposited after the gate electrode and the semiconductor is deposited over the gate, source and drain electrodes. In yet another configuration a top-gate transistor structure may be used. In this case, the order of deposition is typically source-drain contacts, semiconductor, gate dielectric and gate metal. Photoresist is deposited over the layered structure and is exposed through the transparent substrate.

The diagram of FIG. 1A illustrates a transistor fabrication method in accordance with embodiments of the invention. A gate electrode is formed 105 on a first (front) surface of a transparent substrate. A dielectric layer is formed on the gate electrode. A semiconductor layer is deposited 110 over the gate electrode. Source and drain electrodes are formed 115 such that the width of the source and drain electrodes is greater than the width of the gate electrode. Photoresist is deposited 120 on the semiconductor layer. The photoresist is developed 125 by exposure to light through a second (back) surface of the transparent substrate. During exposure to light through the second surface, the gate electrodes mask the photoresist in regions over the gate. Following development of the photoresist, the semiconductor layer is removed 130 in regions that were exposed to the light.

Figure 1B:
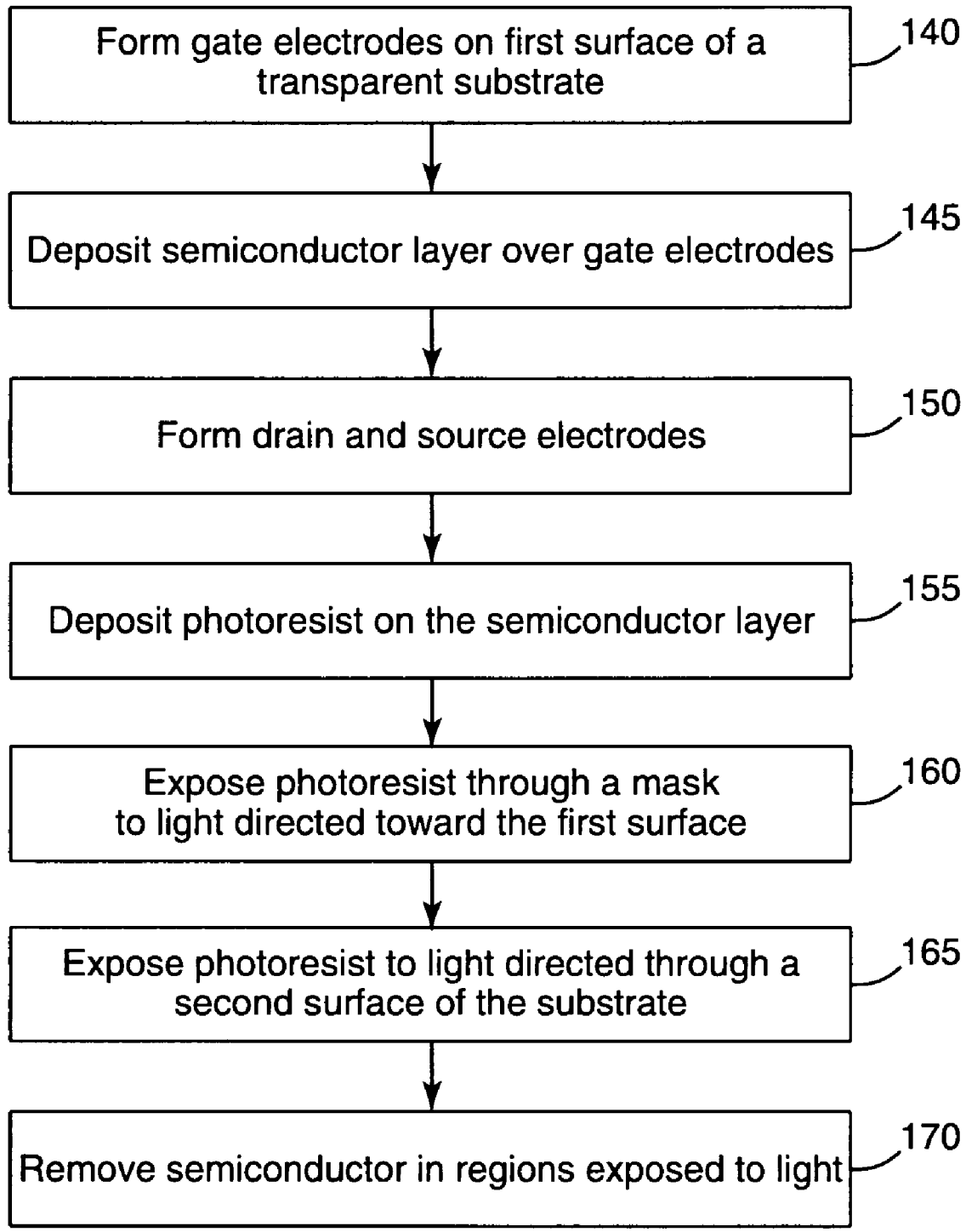

Yet another method involves exposure of the photoresist to light from both sides of the substrate, as illustrated in the diagram of FIG. 1B. The process illustrated in FIG. 1B may produce more efficient removal of the semiconductor material because the photoresist is exposed from both surfaces. In this embodiment, a gate electrode is formed 140 on a first surface of a transparent substrate. A semiconductor layer is deposited 145 over the gate electrode. Source and drain electrodes are formed 150 having widths greater than the width of the gate electrode. Photoresist is deposited 155 on the semiconductor layer. The photoresist is exposed 160 to light directed through a mask toward the first surface of the substrate. The mask defines an island of semiconductor material between the source and drain electrodes. In one configuration, an alignment tolerance of the mask relative to the gate electrode is about ±100 microns. The photoresist is also exposed 165 to light through a second surface of the transparent substrate. During the illumination through the second surface, the gate electrodes mask the photoresist in regions over the gate. Following development of the photoresist, the semiconductor layer is removed 170 in regions that were exposed to the light.

Figure 2A:
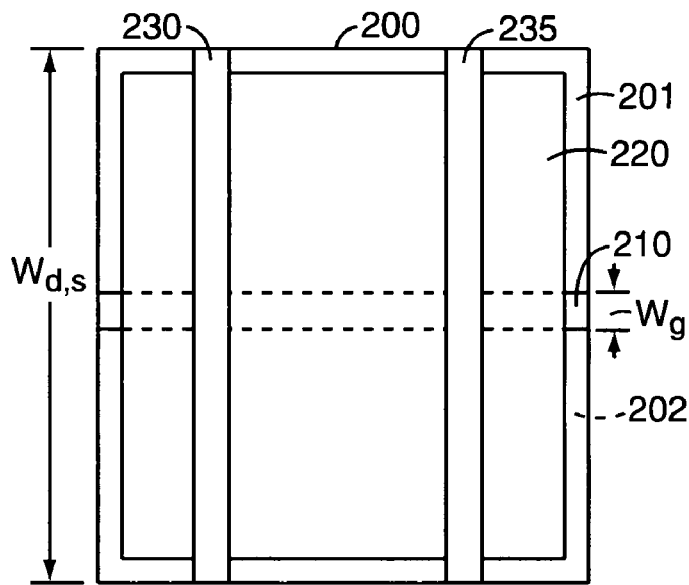
FIGS. 2A-2C illustrate a transistor in various stages during fabrication using the method of FIG. 1B.
Figure 2B:
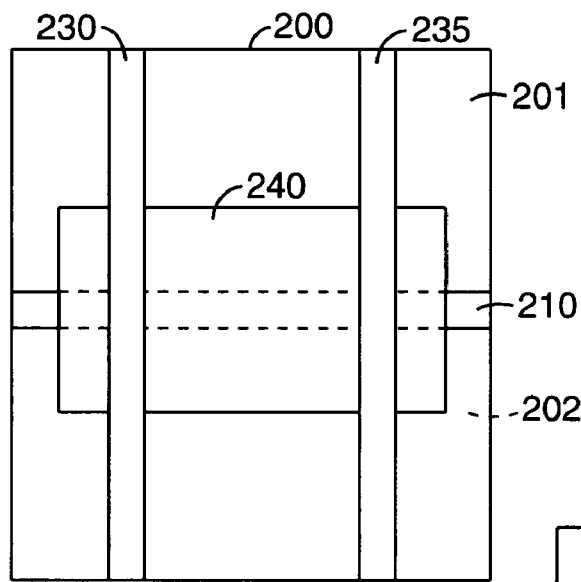
Figure 2C:
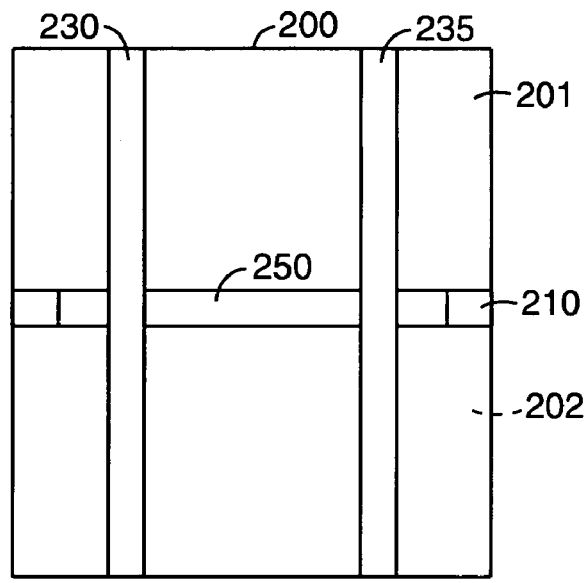

FIGS. 2A-2C illustrate a transistor in various stages during fabrication using the method of FIG. 1B. FIG. 2A illustrates in plan view a gate electrode 210 deposited on a front surface 201 of the substrate 200 which includes front 201 and back 202 surfaces. A semiconductor layer 220 is deposited over the gate electrode 210. Source and drain electrodes 230, 235 are patterned over the semiconductor layer 220. As can be seen in FIG. 2A, the width of the drain and source electrodes, $W_{d,s}$, is greater than the width of the gate, $W_g$. Photoresist is deposited over the semiconductor layer 220. The photoresist is exposed through a mask to light directed toward the front surface 201 of the substrate 200. FIG. 2B shows the region 240 corresponding to the mask used for exposure of the first surface to light. The photoresist is also exposed to light through the back surface 202 of the substrate 200. During exposure through the back surface 202, the gate electrode 210 masks the photoresist deposited on the semiconductor layer to the light. FIG. 2C illustrates the semiconductor region over the gate electrode 210 that remains after removal of the semiconductor from regions where the photoresist was exposed to the light.

Methods in accordance with embodiments of the invention are particularly useful for patterning transistors on flexible substrates. Fabrication of electronic devices on flexible substrates generally requires larger registration tolerance between electronic device layers than fabrication on rigid substrates such as glass. The larger registration tolerance for flexible substrates is needed to account for distortion of the substrate during the fabrication process. Although a larger registration tolerance between layers is required, flexible substrates have the advantage of being less expensive and amenable to high speed roll to roll fabrication processes.

One application for the techniques described in connection with FIGS. 1-2 above is in the area of fabrication of flexible display backplanes. Backplanes for electronic displays may be manufactured using a sequence of photolithographic and deposition processes. These processes require alignment of features formed in one processing step with respect to features formed in a previous processing step. Conventional fabrication methods involve high-resolution photolithography and precise layer-to-layer alignment. These fabrication methods typically require substantial investment in equipment and are only successful when using rigid substrates that are relatively flat, such as substrates of glass or other similar materials. The manufacturing processes for these legacy designs typically use at least 5 photolithography steps.

The processes and requirements of previous methods are less successful when making backplanes on flexible, stretchable substrates, especially when the substrate is a polymer. In particular, polymer substrates may be prone to shrinkage or expansion due to thermal processing, and/or to absorption or desorption of water or other solvents, making layer to layer alignment difficult for conventional designs.

Backplane layouts described herein involve various pixel electrode configurations that provide registration tolerances compatible with fabrication on flexible substrates. The backplane pixel transistors have drain and source electrodes that are wider than the gate electrode to facilitate relaxed registration tolerance between the drain and source electrodes. These pixel transistors may be formed using the back surface illumination techniques descried above.

Backplane layouts described in accordance with various embodiments can be manufactured using a reduced number of photolithography steps (e.g., about 2 or 3 steps) as compared with previous backplane designs. The need for fewer steps simplifies manufacturing and reduces cost. The backplane layouts and fabrication processes presented herein are particularly well suited to roll-to-roll manufacturing using flexible substrates, such as polymer substrates. Backplane layouts that may be formed using the fabrication processes described herein are discussed in U.S. patent application identified by Attorney Docket Number 62260US002, filed concurrently with the present application and incorporated herein by reference.

The backplane designs and fabrication techniques described herein may be used in conjunction with any optically active display medium that is voltage-controlled, requiring little current. A non-limiting list of display media that may be employed includes all forms of liquid crystals (nematic, twisted nematic, super-twisted nematic, polymer-dispersed, ferroelectride, and cholesteric), as well as alternate media including electrophoretics (e.g., "Electronic Paper" from E Ink Corporation, Cambridge, Mass.) and electrochromics. The backplane designs and fabrication techniques described herein may also be used for current controlled displays incorporating organic light emitting diodes (OLEDs).

Figure 3A:
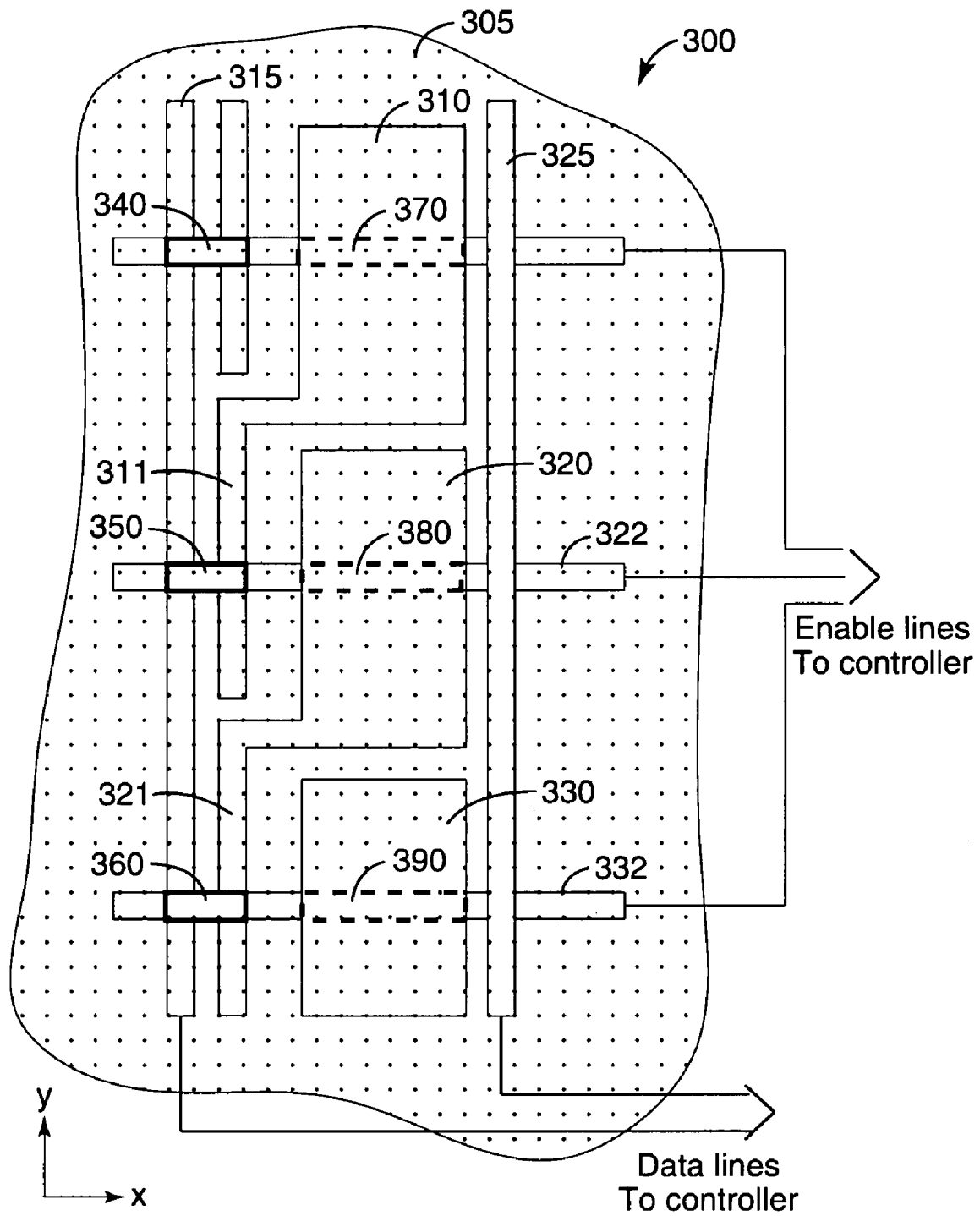
FIGS. 3A-3C each show portions of a backplane layout including a partial column of a matrix of pixel electrodes and corresponding data and enable lines formed on a substrate in accordance with embodiments of the invention.
Figure 3B:
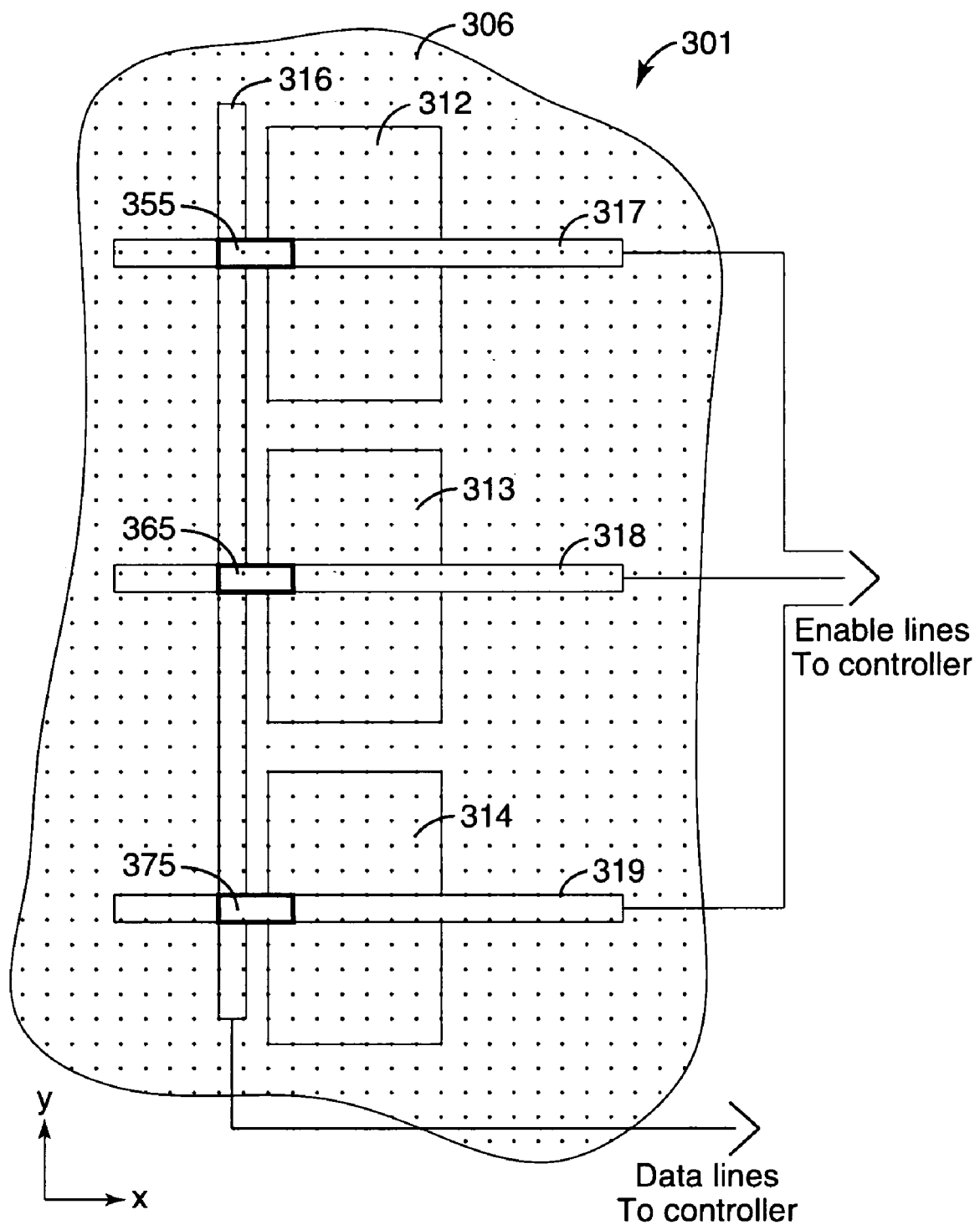
Figure 3C:
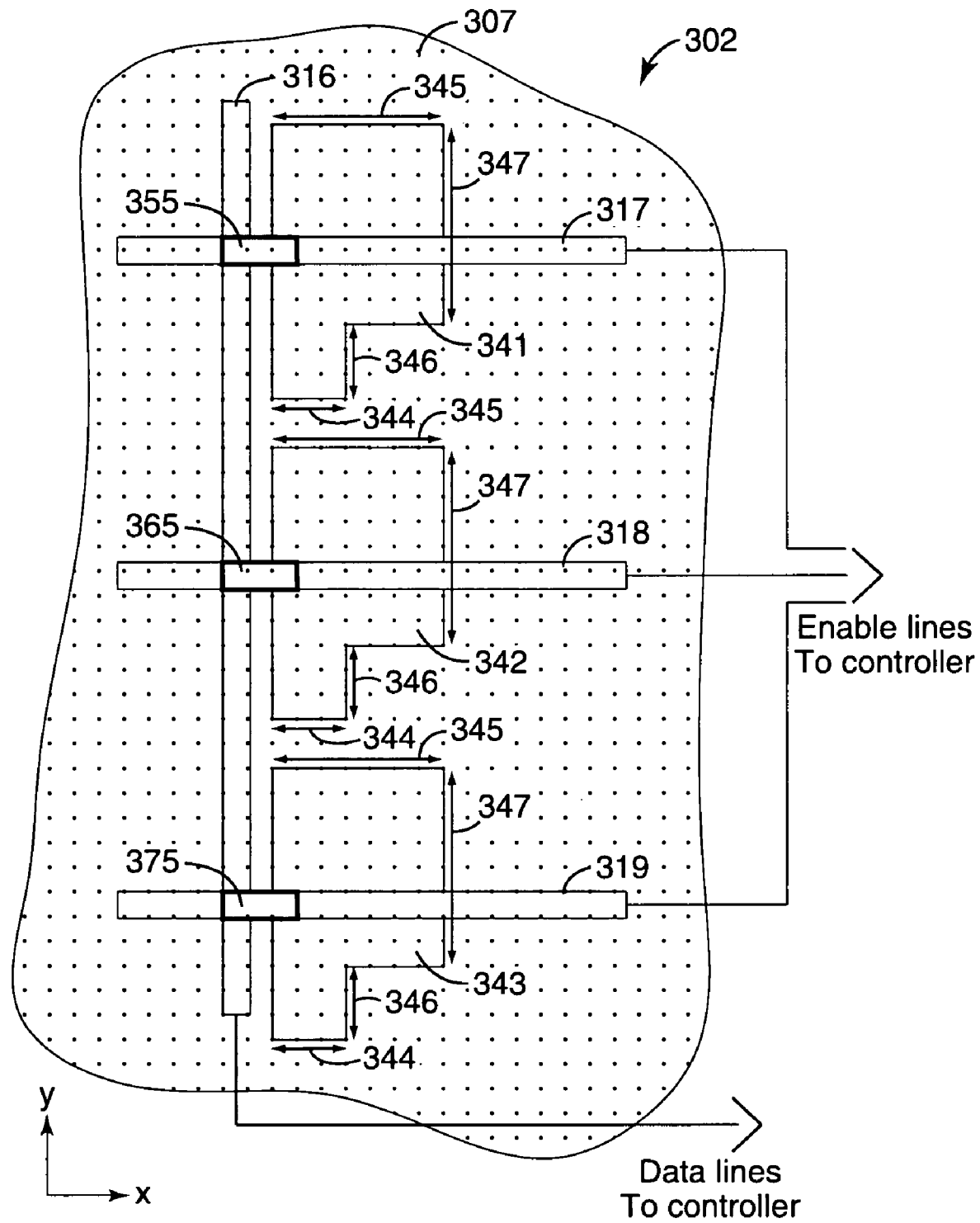
Figure 4:
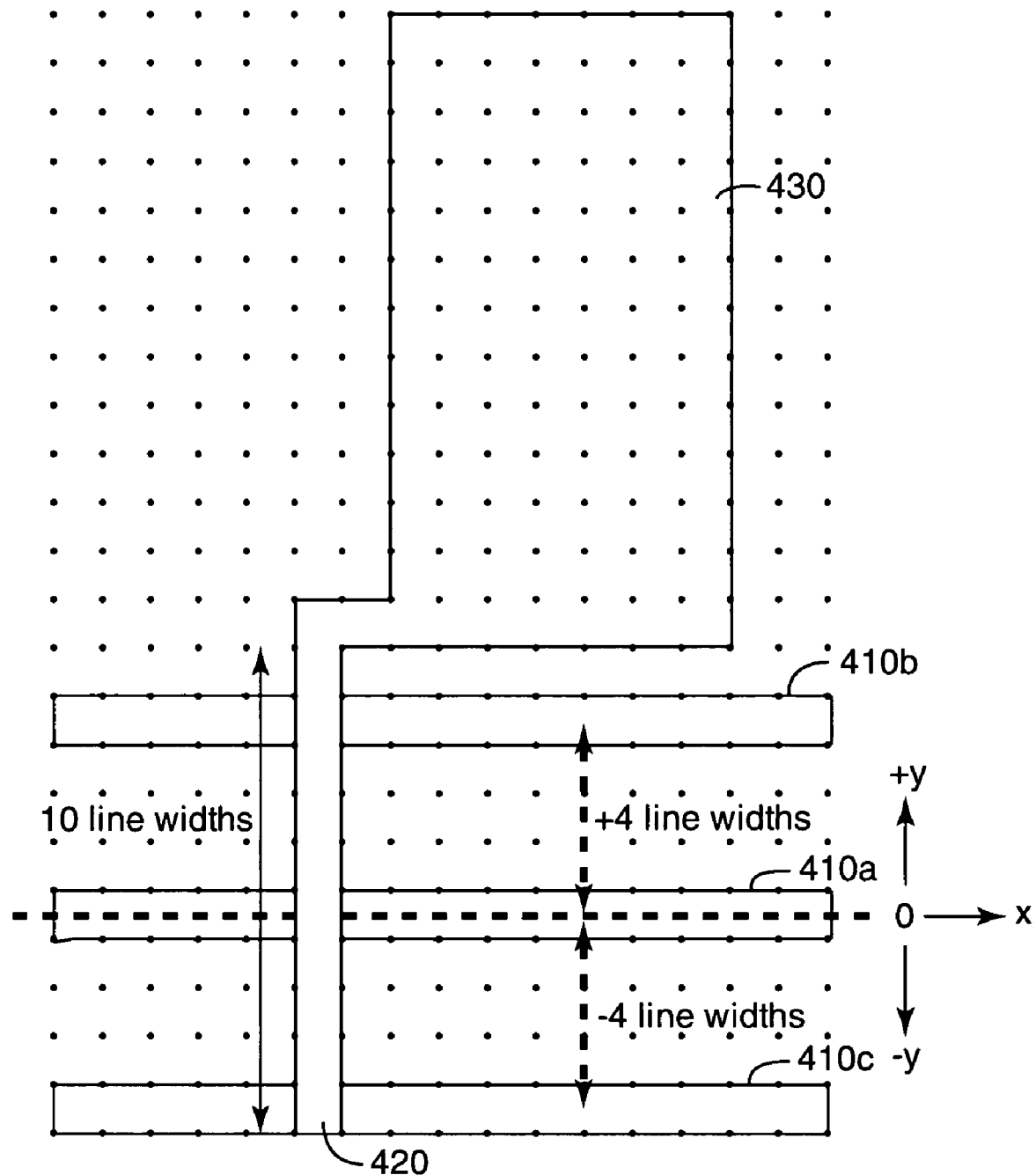
FIG. 4 illustrates the registration tolerance aspect of the backplane layouts of the present invention.
Figure 5:
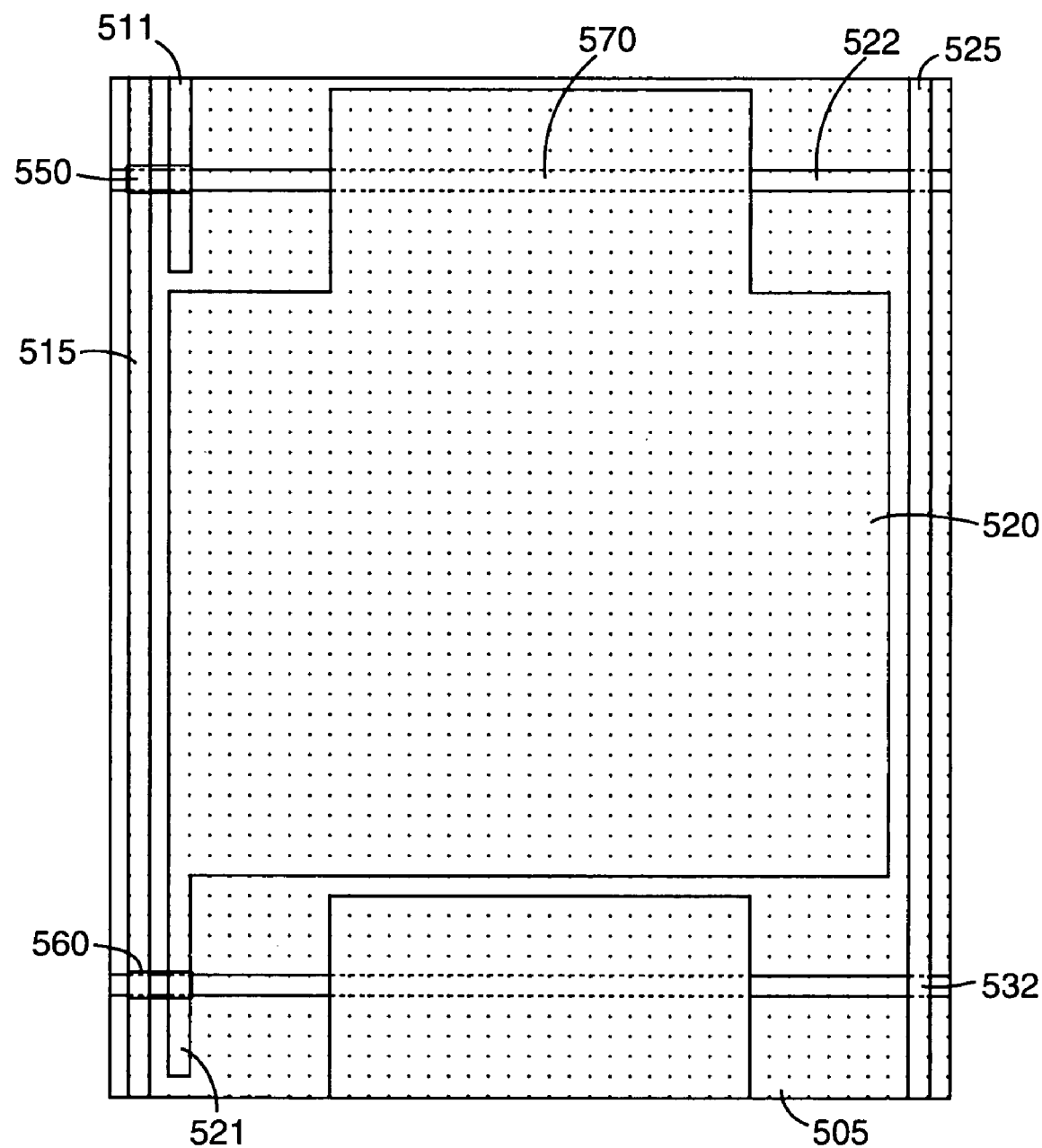
FIG. 5 illustrates a section of a backplane layout in accordance with an embodiment of the invention.

FIGS. 3-5 illustrate sections of backplane layouts in accordance with various embodiments. The size of a backplane may vary to accommodate different display sizes by repeating the pixel electrode configurations illustrated in FIGS. 3-5 for the desired number of pixels. As will be appreciated by those skilled in the art, a complete backplane may include multiple data lines and multiple enable lines that are typically substantially orthogonal to one another along with multiple pixel electrodes arranged in a matrix configuration, although other orientations may be used. A transistor or other switching element is typically associated with each pixel electrode of the backplane. Some embodiments include storage capacitors associated with the pixel electrodes.

The sectional view of the backplane 300 illustrated in FIG. 3A shows a portion of a backplane layout including one partial column of a matrix of pixel electrodes 310, 320, 330 formed on the substrate 305. The substrate 305 may be flexible or stretchable and may comprise a polymer or plastic. The backplane 300 includes data lines 315, 325 that carry data signals to the pixel electrodes 310, 320, 330. The data signals convey information to be displayed via the display pixels (not shown). In some implementations, the data lines 315, 325 are "branchless" conductive lines. In some implementations, the data lines may be branchless along some portions of the data lines, such as at the crossing of the data lines 315, 325 and the enable lines 322, 332. The term branchless denotes a substantially constant line width.

Connections between a data line 315 and pixel electrodes 310, 320 are multiplexed using enable lines 322, 332. The enable lines 322, 332 may be conductive lines that are branchless along the entire length of the enable lines 322, 332. In alternate embodiments, the enable lines may be branchless along certain portions of the enable lines, such as at the crossings of the data lines 315, 325 and the enable lines 322, 332, but may have variable widths elsewhere, such as a larger width in the vicinity of the storage capacitors 370, 380, 390.

Pixel electrodes 310, 320 include electrode extensions 311, 321. In the embodiment illustrated in FIG. 3A, the electrode extension 311 of pixel electrode 310 extends in the direction of a column (in the −y direction as indicated in FIG. 3A) along at least a portion of an edge of the next pixel electrode 320 in the column.

During deposition of the various backplane layers on a flexible substrate, the substrate may distort, causing misalignment to occur between backplane layers. In one configuration, the pixel electrode columns are arranged in the cross web direction, (y direction) and the rows are arranged in the down web direction (x direction). Distortion of the substrate in the cross web direction causes variation in alignment along the column of pixel electrodes between the pixel electrodes or electrode extensions and the enable lines. For example, an enable line at one position, $y_1$, of a column of pixel electrodes may be oriented near the top of an electrode extension. At another position, $y_2$, along the same column, an enable line may be oriented near the bottom of an electrode extension.

The variation in alignment along the column is related to the distortion of the backplane substrate during fabrication.

The registration tolerance between the enable lines and the electrode extensions is related to the length of the electrode extensions 311, 321 and the width of the enable lines 322, 332. The length of the electrode extensions 311, 321 is greater than the width of the enable lines 322, 332 to achieve a desired amount of registration tolerance between the enable lines 322, 332 and the electrode extensions 311, 321. For example, in one embodiment, the length of the electrode extensions 311, 321 is greater than three times the width of the enable lines 322, 332. In other embodiments, the length of the electrode extensions is 4 or more times the width of the enable lines.

Transistors 350, 360 allow current flow between a data line 315 and a pixel electrode 310, 320 via electrode extensions 311, 321. The enable lines 322, 332, which may comprise anodized aluminum, for example, form gate electrodes of transistors 350, 360. The transistors 350, 360 function as switches under the control of the enable lines 322, 332 to selectively couple the data line 315 and the pixel electrodes 310, 320. When switched on, the transistors 350, 360 allow current flow between the data line 315 and the pixel electrodes 310, 320 responsive to a signal on an enable line 322, 332. The direction of current flow within the transistor is substantially parallel to the enable line 322, 332. The transistors 340, 350, 360 are formed using the back surface illumination techniques described in connection with FIGS. 1 and 2 above so that the semiconductor region of the transistors 350, 360 is present only over the enable lines 322, 332 which form the gate electrodes of the transistors 350, 360.

For example, in one configuration, the data line 315 forms the source (or drain) electrodes of the transistors 350, 360 and the electrode extensions 311, 321 form the drain (or source) electrodes of the transistors 350, 360. The source or drain electrodes have widths (i.e., extent in the direction orthogonal to the enable line) greater than the width of the enable line 315.

When a signal on an enable line 322, 332 energizes the gate of a transistor 350, 360, a connection is made through the transistor 350, 360 between the data line 315 and pixel electrode 310, 320. Pixel storage capacitors 380, 390 are disposed where the enable lines 322, 332 and pixel electrodes 320, 330 cross.

The sectional view of the backplane 301 illustrated in FIG. 3B includes one partial column of a matrix of pixel electrodes 312, 313, 314 in accordance with another embodiment. This particular embodiment does not include electrode extensions or storage capacitors. Pixel electrodes 312, 313, 314 are arranged in a matrix on a substrate 306, which may be a flexible, polymeric substrate, for example. Enable lines 317, 318, 319 are arranged substantially orthogonal to data line 316 and the column of pixel electrodes 312, 313, 314. The data line 316, and/or the enable lines 317, 318, 319 may be branchless or may be branchless along certain portions. Transistors 355, 365, 375 allow current to flow between the data line 316 and the pixel electrodes 312, 313, 314 responsive to signals on the enable lines 317, 318, 319.

The pixel electrodes 312, 313, 314 in FIG. 3B are illustrated as rectangles, although they may be formed in other shapes. For example, as illustrated in the backplane FIG. 3C, pixel electrodes 341, 343, 343 are arranged on a substrate 307. The pixel electrodes 341, 342, 343 may comprise a shape having one or more major dimensions 345, 347 and one or more minor dimensions 344, 346. The enable lines 317, 318, 319 cross a major dimension 345, 347 of the pixel electrodes 341, 342, 343.

In FIGS. 3B and 3C, the data line 316 forms the source (or drain) electrodes of the transistors 355, 365, 375 and the pixel electrodes 312, 313, 314 (FIG. 3B) 341, 342, 343 (FIG. 3C) form the drain (or source) electrodes of the transistors 355, 365, 375. The source or drain electrodes have widths (i.e., extent in the direction orthogonal to the enable line) greater than the width of the enable lines.

The transistors 355, 365, 375 are formed using the back surface illumination techniques described in connection with FIGS. 1 and 2 above so that the semiconductor region of the transistors 355, 365, 375 is present only over the portions of enable lines 317, 318, 319 forming the gate electrodes of the transistors 355, 365, 375.

A display backplane, including enable lines, data lines, pixel electrodes, transistors and optional storage capacitors, may be formed as a multilayer structure on the surface of a substrate. For example, in a first processing step, the enable lines and capacitor electrodes may be formed by depositing an opaque or transparent conductor, such as a conductor comprising including aluminum, chromium, molybdenum, tantalum, titanium, copper, or alloys thereof, tin oxide, indium tin oxide, and/or doped zinc oxide on the substrate. Deposition of the conductor is followed by standard photolithography and etching. Portions of the enable lines form the gate electrodes of the switching transistors. A gate insulation film is formed over the transistor gate electrodes. For example, the gate insulator may be formed by anodization of the enable lines. To anodize the enable lines, it is convenient to form the enable lines with a common bus that connects them on one end. The bus connection is used to bias the lines during anodization. Subsequently, the bus connection is removed by etching or cutting away that portion of the substrate.

A thin semiconductor film, e.g., ZnO, a-SiH, or other inorganic or organic semiconductors, is deposited over the gate insulator, such as by sputtering, chemical vapor deposition, vacuum evaporation, or other suitable deposition processes. The transistors may be patterned using the back surface illumination techniques described herein. The pixel electrodes and data lines may be formed in a single step by sputtering a metal layer and patterning by photolithography etching or liftoff.

The backplane layouts illustrated in FIGS. 3A-3C provides for relaxed layer-to-layer registration tolerance when compared to previous backplane designs. The registration tolerance in the cross-web direction (y direction) of the backplane designs illustrated in FIGS. 3B and 3C is related to the length of the pixel electrodes in the direction of the column and the width of the enable lines. The alignment tolerance in the cross-web direction of the backplane design illustrated in FIG. 3A is related to the length of the electrode extensions and the width of the enable lines.

The alignment tolerance aspect of the invention is best understood with reference to FIG. 4. The backplane layout illustrated in FIG. 4 depicts a backplane having a pixel pitch that is 12 times the minimum line width, an aperture ratio of 55%, and an alignment tolerance of ±4 line widths, i.e., 33% of the pixel pitch. A2

In FIG. 4, the length of the electrode extension 420 is 10 times the width of an enable line 410. The pixel electrode/electrode extension layer only needs to be aligned with the enable line layer to within +/−4 enable line widths. The length of the electrode extension 420 may be selected to accommodate misregistration between backplane layers that may be caused by fabrication on a flexible substrate, for example. In one configuration, the enable line has a width of about 25 microns and the electrode extension extends about 100 microns on either side of the enable line. FIG. 4 shows a first alignment scenario with enable line 410a positioned near the middle of the electrode extension 420 in a position designated as a reference position. FIG. 4 illustrates a second alignment scenario corresponding to a maximum misalignment of the pixel electrode/electrode extension 430/420 with respect to the enable line 410b in the positive y direction. The enable line 410b is positioned near the top of the electrode extension 420 which is nearest the pixel electrode 430. A third alignment scenario corresponds to the maximum misalignment of the pixel electrode/electrode extension 430/420 with respect to the enable line 410c in the negative y direction. In the third alignment scenario, the enable line 410c is positioned near the bottom of the electrode extension 420.

FIG. 4 illustrates an electrode extension having a length that is 10 times the width of the enable line, although electrode extensions that are longer or shorter in relation to the width of the enable line may be used. For example, in some embodiments, the electrode extensions may be greater that about three times the width of the enable lines.

The alignment tolerance for a backplane design generally depends on the amount of distortion of the backplane substrate during the fabrication process. For example, a backplane formed on a very rigid substrate may be fabricated with a smaller alignment tolerance than a backplane formed on a flexible substrate. For example, given a backplane having N rows of pixels of height H and enable lines of width W, the length of the pixel extension, L, may be determined according to the equation:

$$L > kNH + W \quad [1]$$

where k is a dimensionless constant that depends on substrate material and thickness and is related to the distortion of the substrate due to various processes to which the backplane substrate is exposed during fabrication.

Note that the value of NH is related to the height of the display. Elastic and inelastic stretching of the substrate web during processing can be a particularly significant factor in the distortion, especially in the down-web direction. For that reason, it is preferable to align the rows in the down-web direction since the designs described herein require minimal alignment along the rows. The designs described herein typically use a value of k larger than about $4 \times 10^{-4}$. Generally, if a polymeric substrate is used, a value of k larger than about $1.0 \times 10^{-4}$ should be used.

As previously mentioned, one aspect of the design illustrated in FIG. 4 is that even for a small pixel pitch of 12 line widths (e.g., about 300 μm) the source-drain layer need only be aligned to the gate to within ±4 line widths (e.g., about 100 μm, or 33% of the pixel pitch) and yet a 55% aperture is achieved. In the backplane layout illustrated in FIG. 3A, the storage capacitance is 6 times the parasitic gate to source capacitance, $C_{st} = 6\, C_{gs}$.

Advantageous features of the above-described backplane layouts include enable lines and transistor gate electrodes that may be branchless metal lines that require little to no alignment in the x dimension along the rows. In addition, the source and drain electrodes of the transistors are much wider in the direction perpendicular to the current flow than the gate enable line itself, thus relaxing the alignment tolerance in the direction perpendicular to the current flow. These features are achieved with minimal degradation of the resolution and performance of the display that incorporates the backplane.

The pixel pitch, aperture ratio, and alignment tolerance of backplane layouts in accordance with embodiments of the invention may vary. FIG. 5 illustrates a section of a backplane layout in accordance with another embodiment. The plan view illustrated in FIG. 5 shows a pixel electrode 520 disposed between data lines 515, 525 and enable lines 522, 532 on a substrate 505. The pixel electrode 520 includes an electrode extension 521. A portion of an adjacent electrode extension 511 is also shown. The backplane layout illustrated in FIG. 5 includes transistors 550, 560 and storage capacitor 570 for the pixel electrode 520.

The backplane layout of FIG. 5 has a different fraction of pixel pitch to minimum line width when compared to the embodiment illustrated in FIG. 3A. In the backplane layouts illustrated in FIGS. 3A and 5, the alignment tolerance is ±4 line widths. However, the layout of FIG. 5 has a pixel pitch of about 40 times the minimum line width and an aperture ratio is about 81%. The storage capacitance is 22 times the parasitic gate to source capacitance, $C_{st} = 22\, C_{gs}$ for this design.

The semiconductor may be patterned proximate the enable lines 522, 532 to form the switching transistors 550, 560, as illustrated, for example, in FIG. 5. Patterning the semiconductor is performed via back surface illumination so that the semiconductor of the transistors 550, 560 does not extend substantially beyond the areas associated with a portion of the enable lines 522, 532 between data line 515 and electrode extensions 511, 521.

EXAMPLE

A monochrome display was fabricated on CORNING 1737 glass substrates using the design illustrated in FIG. 5. The minimum line width was 25 μm, with a pixel pitch of 1 mm. The experimental display included 12 rows and 16 columns. The 150 nm thick gate layer was formed from sputtered Al using standard photolithography and etching. That layer was anodized to form an $Al_2O_3$ gate insulator. A solution of tartaric acid in ethylene glycol was used for the anodization (see "Nanostructure and electrical properties of anodized Al gate insulator for thin film transistors," T. Arai, Y. Hiromasu, and S. Tsuji, Mat. Res. Soc. Symp., Vol. 424, p. 37 (1991)), with an initial current density of 1.5 $mA/cm^2$ and a final voltage of 60 V, resulting in a specific capacitance of approximately 1000 $pF/mm^2$ and an oxide thickness of about 78 nm. A semiconductor layer of ZnO was RF sputtered in an $Ar—O_2$ plasma onto the substrate to a thickness of 15 nm. Positive photoresist was spun onto the sample, exposed with UV light through the substrate and developed. The ZnO was patterned by etching in 0.1% HCl and the photoresist was removed. A source-drain metal layer of 100 nm of Al was sputtered onto the substrate and patterned by standard photolithography and liftoff. Polymer-dispersed liquid crystal film (model NCAP DP4 from Xymox Technologies Inc., 1277 Reamwood Avenue, Sunnyvale, Calif.) was laminated onto the backplane. This film includes a transparent conductive electrode that was used for the front electrode of the display. The resultant display was tested at frame rates of up to 50 frames/s using a row-enable voltage of 25 V, row-disable voltages of 0 V, and column data voltages of 0-25 V, all referenced to the transparent front electrode held at 0 V. The display was observed to successfully display images as designed.

The foregoing description of the various embodiments of the invention has been presented for the purposes of illustration and description. It is not intended to be exhaustive or to limit the invention to the precise form disclosed. Many modifications and variations are possible in light of the above teaching. For example, embodiments of the present invention may be implemented in a wide variety of applications. It is intended that the scope of the invention be limited not by this detailed description, but rather by the claims appended hereto.

What is claimed is:

1. A method of patterning a semiconductor layer to form a display backplane, comprising:

forming gate, source, and drain electrodes of a transistor on a transparent substrate having a first surface and a second surface, a width of the drain electrode and a width of the source electrode greater than a width of the gate electrode, wherein forming the source and drain electrodes comprises forming data lines and pixel electrodes of the display backplane and forming the gate electrodes comprises forming enable lines of the display backplane;

depositing a semiconductor layer comprising ZnO or a-Si:H proximate to the gate, source and drain electrodes;

depositing photoresist over the semiconductor layer;

exposing the photoresist through a mask to light directed toward the first surface of the transparent substrate;

exposing the photoresist to light directed through the second surface of the transparent substrate, the gate electrode masking the photoresist from the light; and removing the semiconductor layer in regions exposed to the light.

2. The method of patterning a semiconductor layer according to claim 1, wherein:

forming the gate electrode comprises forming the gate electrode on the first surface of the transparent substrate; and depositing the semiconductor layer comprises depositing the semiconductor layer over the gate electrode.

3. The method of patterning a semiconductor layer according to claim 1, wherein the width of the drain and source electrodes and the width of the gate electrode accommodates misregistration of the gate electrodes with at least one of the drain and source electrodes.

4. The method of patterning a semiconductor layer according to claim 1, wherein an alignment tolerance of the mask relative to the gate electrodes is about +/−100 microns.

5. The method of patterning a semiconductor layer according to claim 1, wherein the width of at least one of the drain and source electrodes is greater than about three times the width of the gate electrodes.

6. The method of patterning a semiconductor layer according to claim 1, wherein the transparent substrate comprises a flexible substrate.

7. The method of patterning a semiconductor layer according to claim 1, wherein the transparent substrate comprises a polymer.

8. A method of fabricating a display backplane, comprising:

forming enable lines of the display backplane on a transparent substrate having a first surface and a second surface, the enable lines comprising gate electrodes of transistors;

forming an array of pixel electrodes and data lines on the transparent substrate, the array of pixel electrodes forming columns of pixel electrodes, each pixel electrode including an electrode extension oriented substantially orthogonal to the enable lines, the electrode extensions forming source or drain electrode of the transistors;

depositing a semiconductor layer proximate to the enable lines, the pixel electrodes, and the data lines;

depositing photoresist over the semiconductor layer;

exposing the photoresist through a mask to light directed toward the first surface of the transparent substrate;

exposing the photoresist to light directed through the second surface of the transparent substrate, the enable lines masking the photoresist from the light; and removing the semiconductor layer in regions where the photoresist was exposed to the light.

9. The method of fabricating a display backplane according to claim 8, wherein each electrode extension extends in a direction of a column along an edge of a next pixel electrode in the column.

10. The method of fabricating a display backplane according to claim 8, further comprising selecting a length of the electrode extensions to achieve a desired alignment tolerance between backplane layers.

11. The method of fabricating a display backplane according to claim 8 wherein alignment of the enable lines and the pixel electrodes varies across the backplane, the variation in alignment related to substrate distortion during fabrication.

12. The method of fabricating a display backplane according to claim 8, further comprising distorting the transparent substrate during fabrication, the distortion causing misalignment of the enable lines and the electrode extensions.

13. The method of fabricating a display backplane according to claim 8, further comprising forming storage capacitors where the enable lines cross the pixel electrodes.

14. A method of fabricating a display backplane, comprising:

patterning enable lines and data lines on a transparent substrate having a first surface and a second surface, the width of the data lines being greater than about three times the width of the enable lines;

forming a semiconductor layer over the enable lines;

depositing photoresist over the semiconductor layer;

exposing the photoresist through a mask to light directed toward the first surface of the transparent substrate;

exposing the photoresist to light through the second surface of the transparent substrate; and removing the semiconductor layer in regions exposed to the light.

15. The method of fabricating a display backplane according to claim 14, wherein the transparent substrate is flexible.

* * * * *

UNITED STATES PATENT AND TRADEMARK OFFICE
CERTIFICATE OF CORRECTION

PATENT NO. : 7,629,206 B2  Page 1 of 1
APPLICATION NO. : 11/710880
DATED : December 8, 2009
INVENTOR(S) : Michael A Haase It is certified that error appears in the above-identified patent and that said Letters Patent is hereby corrected as shown below:

Column 8

Line 58; After "pitch." delete "A2".

Signed and Sealed this

Eighteenth Day of May, 2010

David J. Kappos
*Director of the United States Patent and Trademark Office*